US012731628B2

(12) United States Patent
Kim et al.

(10) Patent No.: US 12,731,628 B2
(45) Date of Patent: Sep. 8, 2026

(54) MEMORY DEVICE AND MEMORY SYSTEM FOR PERFORMING TARGET REFRESH OPERATION

(71) Applicant: SK hynix Inc., Gyeonggi-do (KR)

(72) Inventors: Hyun Seung Kim, Gyeonggi-do (KR); Sung Je Roh, Gyeonggi-do (KR); Kang Seol Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 229 days.

(21) Appl. No.: 18/455,631

(22) Filed: Aug. 25, 2023

(65) Prior Publication Data

US 2024/0347094 A1 Oct. 17, 2024

(30) Foreign Application Priority Data

Apr. 14, 2023 (KR) ........................ 10-2023-0049260

(51) Int. Cl.
*G11C 11/406* (2006.01)
*G11C 11/408* (2006.01)

(52) U.S. Cl.
CPC .. *G11C 11/40603* (2013.01); *G11C 11/40615* (2013.01); *G11C 11/4085* (2013.01)

(58) Field of Classification Search
CPC ........ G11C 11/40603; G11C 11/40615; G11C 11/4085; G11C 11/4087; G11C 11/4074; G11C 11/40611; G11C 11/4076
See application file for complete search history.

(56) References Cited

U.S. PATENT DOCUMENTS 6,507,532 B1 * 1/2003 Fujino ...................... G11C 8/12 365/230.03
7,161,858 B2 * 1/2007 Ha ........................ G11C 11/406 365/230.03
2004/0136250 A1 * 7/2004 Takahashi ........... G11C 11/4094 365/203
2017/0178713 A1 6/2017 Perego et al.
2023/0083475 A1 * 3/2023 Joo ......................... G06F 1/206 365/244
2024/0028221 A1 * 1/2024 Lee ....................... G06F 3/0623

FOREIGN PATENT DOCUMENTS

KR 10-2017-0112038 A 10/2017
KR 10-2329673 B1 11/2021

* cited by examiner

*Primary Examiner* — Sultana Begum
(74) *Attorney, Agent, or Firm* — IP & T GROUP LLP

(57) ABSTRACT

A memory device includes an active control circuit configured to generate an internal active signal and an internal precharge signal according to one of an active command and a precharge command, and generate a row active signal according to the active command, the internal active signal, the precharge command, and the internal precharge signal; an address control circuit configured to generate a row address corresponding to an active address and an adjacent address adjacent to the active address; and a row control circuit configured to activate at least one word line corresponding to the row address according to the row active signal.

20 Claims, 9 Drawing Sheets

100
CK
C/A
171
CLOCK BUFFER
CLK
172
CA BUFFER
ICMD
IADD
173
COMMAND DECODER
ACT
PCG
REF
RD/WT
174
ADDRESS GENERATION CIRCUIT
RADD
CADD
142
REFRESH COUNTER
REF
CNT_ADD
150
ACTIVE CONTROL CIRCUIT
REF
PCG
ACT
RACT
160
ADDRESS CONTROL CIRCUIT
RADD
X_RA
CNT_ADD
148
REF
S_ADD
120
ROW CONTROL CIRCUIT
WL
110
BL
130
COLUMN CONTROL CIRCUIT
SAEN(RACT)
RD/WT
CADD
DQ

MEMORY DEVICE AND MEMORY SYSTEM FOR PERFORMING TARGET REFRESH OPERATION

CROSS-REFERENCE TO RELATED APPLICATION

The present application claims the benefit of Korean Patent Application No. 10-2023-0049260, filed on Apr. 14, 2023, which is incorporated herein by reference in its entirety.

BACKGROUND

1. Field

Various embodiments of the present invention relate to semiconductor design technology, and more particularly, to a memory system including a memory device performing a target refresh operation.

2. Description of the Related Art

Recently, in addition to a normal refresh operation for sequentially refresh a plurality of word lines, an additional refresh operation which will be, hereinafter, referred to as a 'target refresh operation', is being performed on a specific word line that is likely to lose data due to row hammering. The row hammering refers to a phenomenon in which data of memory cells coupled to a specific word line or the word lines disposed adjacent to the specific word line are damaged due to a high number of activations of the specific word line. In order to prevent the row hammering, a target refresh operation is performed on word lines disposed adjacent to a word line that is activated more than a predetermined number of times which is, hereinafter, referred to as a 'target word line'.

In order to select a word line to be refreshed during the target refresh operation, a memory device needs to detect word lines that are activated more than a preset number of times, store addresses for detected word lines, or randomly sample addresses and store sampled addresses. Accordingly, the memory device has counting circuits, sampling circuits, and/or address storage circuits to detect and store addresses of word lines. As technology scaling progresses and the size of the memory devices decrease, the proportion of areas occupied by these circuits increases.

SUMMARY

Embodiments of the present invention are directed to a memory device capable of performing a target refresh operation on adjacent word lines of a target word line while performing an active operation on the target word line.

According to an embodiment of the present invention, a memory device includes an active control circuit configured to generate an internal active signal and an internal precharge signal according to one of an active command and a precharge command, and generate a row active signal according to the active command, the internal active signal, the precharge command, and the internal precharge signal; an address control circuit configured to generate a row address corresponding to an active address and an adjacent address adjacent to the active address; and a row control circuit configured to activate at least one word line corresponding to the row address according to the row active signal.

According to an embodiment of the present invention, an operating method of a memory device includes generating an internal precharge signal according to an active command; activating at least one first word line corresponding to one of an active address and an adjacent address according to the active command, and deactivating the activated first word line according to the internal precharge signal; generating an internal active signal according to the internal precharge signal; and activating at least one second word line corresponding to the remaining one of the active address and the adjacent address according to the internal active signal, and deactivating the activated second word line according to the precharge command.

According to an embodiment of the present invention, an operating method of a memory device includes activating at least one first word line corresponding to one of an active address and an adjacent address according to an active command, and deactivating the activated first word line according to a precharge command; generating an internal active signal according to the precharge command; generating an internal precharge signal according to the internal active signal; and activating at least one second word line corresponding to the remaining one of the active address and the adjacent address according to the internal active signal, and deactivating the activated second word line according to the internal precharge signal.

According to an embodiment of the present invention, a memory system includes a controller configured to provide an active command and a precharge command with a row address; and a memory device configured to generate an internal active signal and an internal precharge signal according to one of the active command and the precharge command, generate a row active signal according to the active command, the internal active signal, the precharge command, and the internal precharge signal, and activate a target word line corresponding to the row address or adjacent lines adjacent to the target word line according to the row active signal.

Further, according to embodiments of the present invention, the memory device and the memory system may minimize the area occupied by circuits for detecting and storing target addresses for a target word line by performing a target refresh operation on adjacent word lines while performing an active operation on the target word line.

DETAILED DESCRIPTION

Figure 1:
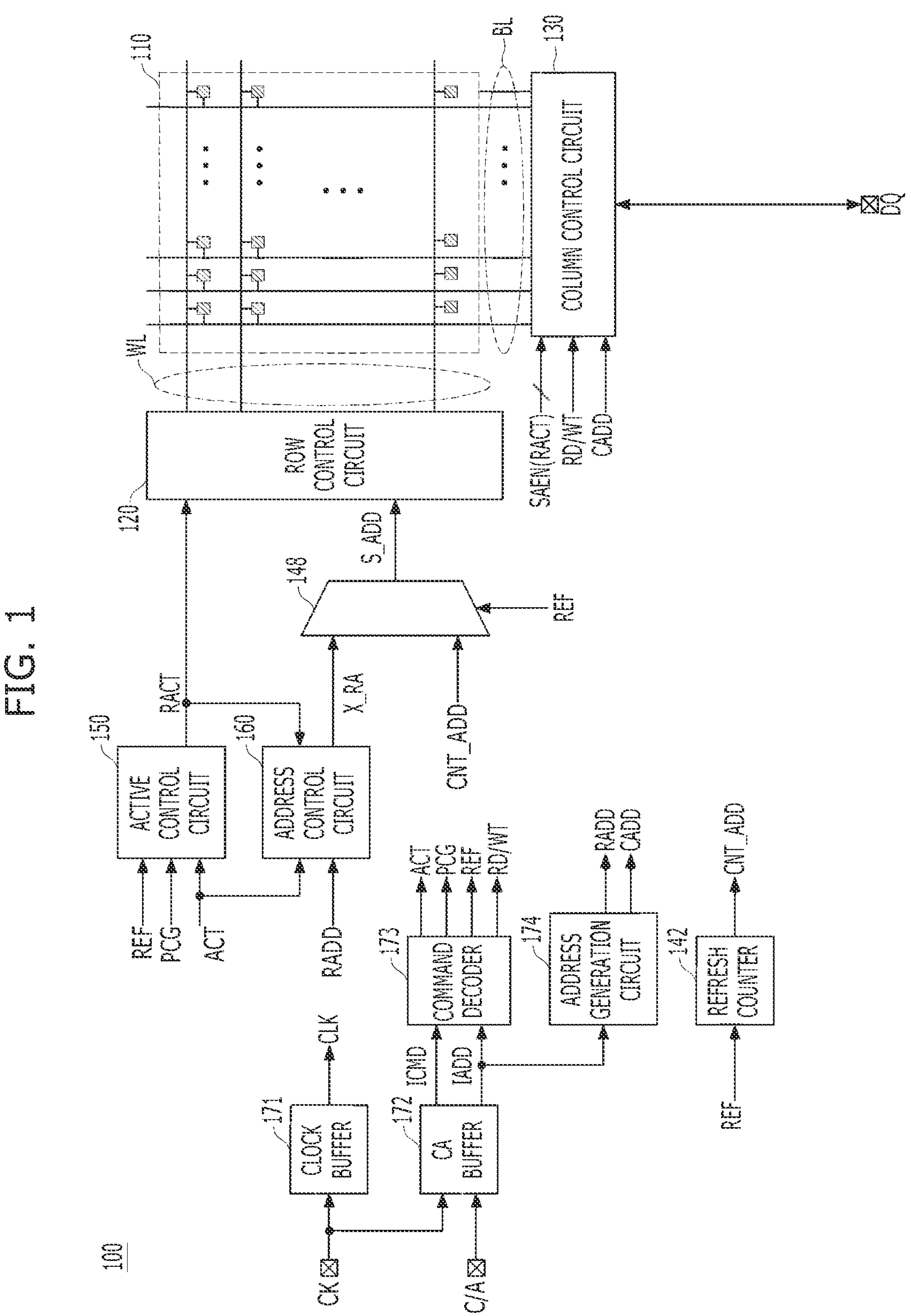
FIG. 1 is a block diagram illustrating a memory device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Hereinafter, in order to describe the gist of the present invention, a row control aspect related to a refresh operation will be mainly described.

FIG. 1 is a block diagram illustrating a memory device 100 in accordance with an embodiment of the present invention.

Referring to FIG. 1, the memory device 100 may include a memory cell region 110, a row control circuit 120, a column control circuit 130, a refresh counter 142, an address selection circuit 148, an active control circuit 150, an address control circuit 160, a clock buffer 171, a command/address (CA) buffer 172, a command decoder 173, and an address generation circuit 174.

The memory cell region 110 may include a plurality of memory cells respectively coupled between a plurality of word lines WL and a plurality of bit lines BL. The plurality of word lines WL may extend in a first direction (e.g., a row direction) and may be sequentially disposed in a second direction (e.g., a column direction). The plurality of bit lines BL may extend in the column direction and may be sequentially disposed in the row direction. The plurality of memory cells may be composed of memory cells that require a refresh operation to secure data retention time. The memory cell region 110 may be composed of at least one bank. The number of banks or the number of memory cells may be determined depending on the capacity of the memory device 100.

The clock buffer 171 may receive a clock signal CK from an external device (e.g., a memory controller). The clock buffer 171 may generate an internal clock signal CLK by buffering the clock signal CK. Depending on an embodiment, the memory controller 200 may transfer system clocks to the memory device 100 in a differential manner, and the memory device 100 may include clock buffers that receive the differential clocks, respectively.

The CA buffer 172 may receive a command/address signal C/A from the memory controller based on the clock signal CK. The CA buffer 172 may sample the command/address signal C/A based on the clock signal CK and output an internal command ICMD and an internal address IADD. Consequently, the memory device 100 may be synchronized with the clock signal CK.

The command decoder 173 may decode the internal command ICMD which is output from the CA buffer 172 to generate an active command ACT, a precharge command PCG, a normal refresh command REF, a read command RD, and a write command WT. The normal refresh command REF is a command for a normal refresh operation that sequentially refreshes the plurality of word lines WL. The command decoder 173 may additionally generate a mode register command for setting a mode and the like by decoding the internal command ICMD.

The address generation circuit 174 may classify the internal address IADD received from the CA buffer 172 as a row address RADD and a column address CADD. Depending on an embodiment, the address generation circuit 174 may classify some bits of the internal address IADD as a row address RADD and classify the remaining bits as a column address CADD. The address generation circuit 174 may classify the internal address IADD as a row address RADD when an active operation is directed as a result of the decoding by the command decoder 173 and may classify the internal address IADD as a column address CADD when a read or write operation is directed. The plurality of word lines WL may be accessed by the row address RADD, and the plurality of bit lines BL may be accessed by the column address CADD.

The refresh counter 142 may generate a counting address CNT_ADD whose value increases sequentially every time the normal refresh command REF is input. The word lines WL may be sequentially refreshed during a normal refresh operation according to the counting address CNT_ADD.

The active control circuit 150 may generate an internal active signal (IACT in FIG. 2 or 8) and an internal precharge signal (IPCG in FIG. 2 or 8) according to one of the active command ACT and the precharge command PCG. Further, the active control circuit 150 may generate a row active signal RACT according to the active command ACT, the internal active signal IACT, the precharge command PCG, and the internal precharge signal IPCG. The active control circuit 150 may activate the row active signal RACT in response to the active command ACT or the internal active signal IACT and may deactivate the row active signal RACT in response to the internal precharge signal IPCG or the precharge command PCG. In addition, the active control circuit 150 may additionally receive the normal refresh command REF to generate the row active signal RACT that is activated according to the normal refresh command REF and deactivated after a minimum row active time (tRASmin). The row active signal RACT is a signal for activating (or selecting) at least one word line among the plurality of word lines WL. Hereinafter, a case in which the row active signal RACT is activated to a logic high level and deactivated to a logic low level will be described as an example.

Figure 6:
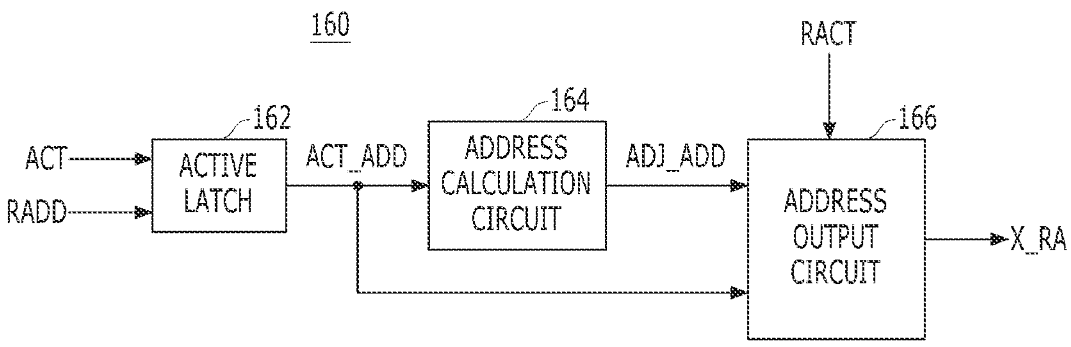
FIG. 6 is a detailed block diagram illustrating an address control circuit of FIG. 1.

The address control circuit 160 may generate an active address (ACT_ADD in FIG. 6) by latching the row address RADD input with the active command ACT, generate adjacent address candidates by adding or subtracting a certain value to or from the active address ACT_ADD, and output one of the adjacent address candidates as an adjacent address (ADJ_ADD in FIG. 6). The address control circuit 160 may generate a row address X_RA corresponding to the active address ACT_ADD and the adjacent address ADJ_ADD, according to the row active signal RACT. For example, the address control circuit 160 may alternately output the active address ACT_ADD and the adjacent address ADJ_ADD as the row address X_RA whenever the row active signal RACT is activated.

The address selection circuit 148 may output a final row address S_ADD by selecting one of the row address X_RA and the counting address CNT_ADD, according to the normal refresh command REF. For example, the address selection circuit 148 may output the counting address CNT_ADD as the final row address S_ADD when the normal refresh command REF is input. The address selection circuit 148 may output the row address X_RA as the final row address S_ADD when the normal refresh command REF is not input.

The row control circuit 120 may be coupled to the memory cell region 110 through the word lines WL. The row control circuit 120 may select or activate at least one word line selected by the final row address S_ADD according to the row active signal RACT. That is, the row control circuit 120 may perform an active operation of activating a word line corresponding to the row address X_RA among the word lines WL when the active command ACT is input and may perform a precharge operation of deactivating the activated word line when the precharge command PCG is input. The row control circuit 120 may perform a normal refresh operation of activating a word line corresponding to the counting address CNT_ADD when the normal refresh command REF is input.

The column control circuit 130 may select and amplify a predetermined number of bit lines BL corresponding to the column address CADD according to a sense amplifier enable signal SAEN, and transfer data DQ between the memory cell region 110 and a data pad when the read command RD or the write command WT is input. For example, the column control circuit 130 may include a column selection circuit, a sense amplifier circuit, and a data input/output circuit. The column selection circuit may decode the column address CADD to select a predetermined number of bit lines BL. The sense amplifier circuit may sense and amplify data of the selected bit lines BL according to the sense amplifier enable signal SAEN. The sense amplifier enable signal SAEN may be controlled by the row active signal RACT, which is activated when the row active signal RACT is activated, and deactivated when the row active signal RACT is deactivated. During an active operation or a refresh operation, the sense amplifier circuit is enabled according to the sense amplifier enable signal SAEN to sense and amplify the data of the selected bit lines BL. The data input/output circuit may receive the data DQ to be written to the memory cell region 110 during a write operation according to the write command WT. The data input/output circuit may transmit the data DQ read from the memory cell area region 110 during a read operation according to the read command RD.

Hereinafter, a detailed configuration and operation of components in accordance with an embodiment of the present invention will be described with reference to the drawings.

In an embodiment of the present invention, the active control circuit 150 may generate an internal active signal IACT and an internal precharge signal IPCG according to an active command ACT, or generate an internal active signal IACT and an internal precharge signal IPCG according to a precharge command PCG. In the following embodiment, an embodiment in which the active control circuit 150 generates the internal active signal IACT and the internal precharge signal IPCG according to the active command ACT will be described first.

Figure 2:
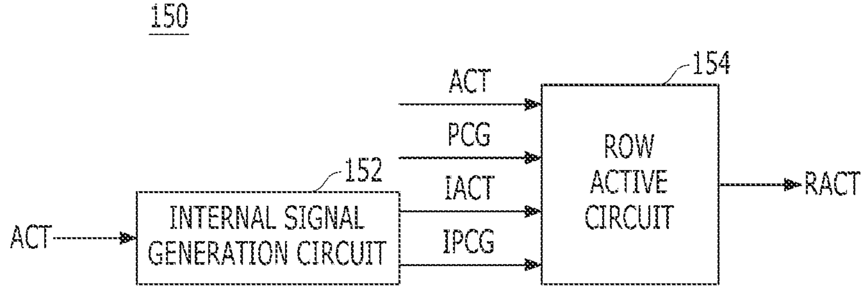
FIG. 2 is a detailed block diagram illustrating an active control circuit of FIG. 1 in accordance with an embodiment of the present invention.
Figure 3:
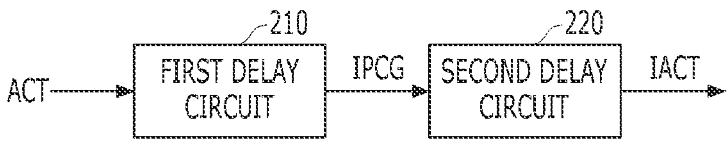
FIG. 3 is a detailed block diagram illustrating an internal signal generation circuit of FIG. 2.
Figure 4:
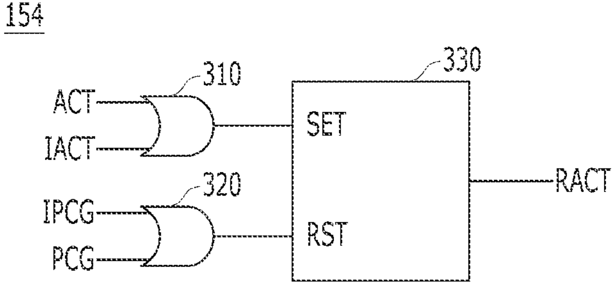
FIG. 4 is a circuit diagram illustrating a row active circuit of FIG. 2.

FIG. 2 is a detailed block diagram illustrating the active control circuit 150 of FIG. 1 in accordance with an embodiment of the present invention. FIG. 3 is a detailed block diagram illustrating an internal signal generation circuit 152 of FIG. 2. FIG. 4 is a circuit diagram illustrating a row active circuit 154 of FIG. 2.

Referring to FIG. 2, the active control circuit 150 may include the internal signal generation circuit 152 and the row active circuit 154.

The internal signal generation circuit 152 may activate an internal precharge signal IPCG after a first delay time from an input of an active command ACT and activate an internal active signal IACT after a second delay time from an activation of the internal precharge signal IPCG.

For reference, when a memory controller applies an active command ACT and a precharge command PCG to the memory device, the memory controller may apply the precharge command PCG by securing a minimum row active time (tRASmin) defined in the specification from an application of the active command ACT. In addition, the memory controller may apply the active command ACT by securing a minimum precharge time (tRPmin) defined in the specification from an application of the precharge command PCG. That is, an application interval from the active command ACT to the precharge command PCG may be set longer than the minimum row active time (tRASmin), and an application interval from the precharge command PCG to the active command ACT may be set longer than the minimum precharge time (tRPmin).

In the embodiment of the present invention, the first delay time may correspond to the minimum row active time (tRASmin), and the second delay time may correspond to the minimum precharge time (tRPmin). That is, the internal signal generation circuit 152 may activate the internal precharge signal IPCG after the minimum row active time (tRASmin) from the input of the active command ACT and activate the internal active signal IACT after the minimum precharge time (tRPmin) from the activation of the internal precharge signal IPCG. In the illustrated embodiment of FIG. 3, the internal signal generation circuit 152 may include a first delay circuit 210 and a second delay circuit 220. The first delay circuit 210 may delay the active command ACT by the first delay time to generate the internal precharge signal IPCG. The second delay circuit 220 may delay the internal precharge signal IPCG by the second delay time to generate the internal active signal IACT. Accordingly, the active command ACT, the internal precharge signal IPCG, and the internal active signal IACT may be sequentially activated.

The row active circuit 154 may generate the row active signal RACT that is activated according to the active command ACT or the internal active signal IACT and deactivated according to the internal precharge signal IPCG or the precharge command PCG. In the illustrated embodiment of FIG. 4, the row active circuit 154 may include a first logic gate 310, a second logic gate 320, and an SR latch 330. The first logic gate 310 may generate a set signal SET by performing a logic OR operation on the active command ACT and the internal active signal IACT. The second logic gate 320 may generate a reset signal RST by performing a logic OR operation on the internal precharge signal IPCG and the precharge command PCG. The SR latch 330 may generate the row active signal RACT that is set to a logic high level according to the set signal SET and set to a logic low level according to the reset signal RST.

In an embodiment, the active control circuit 150 may further include a circuit for additionally receiving the normal refresh command REF to generate the row active signal RACT.

Figure 5:
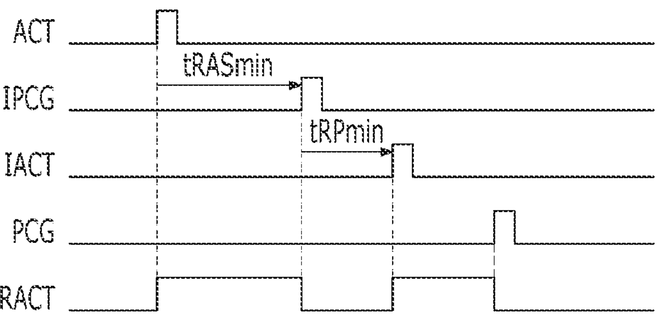
FIG. 5 is a timing diagram for describing an operation of an active control circuit of FIG. 2.

FIG. 5 is a timing diagram for describing an operation of the active control circuit 150 of FIG. 2.

Referring to FIG. 5, the internal signal generation circuit 152 may activate the internal precharge signal IPCG after the minimum row active time (tRASmin) from the input of an active command ACT and activate the internal active signal IACT after the minimum precharge time (tRPmin) from the activation of the internal precharge signal IPCG. In this case, the memory controller may provide the active command ACT and the precharge command PCG to the memory device by setting the application interval from the active command ACT to the precharge command PCG to be longer than a time (tRASmin+tRPmin+tRASmin).

Since the active command ACT, the internal precharge signal IPCG, and the internal active signal IACT are activated sequentially, the row active circuit 154 may generate the row active signal RACT in which a first activation section is defined by the active command ACT and the internal precharge signal IPCG, and a second activation section is defined by the internal active signal IACT and the precharge command PCG.

FIG. 6 is a detailed block diagram illustrating the address control circuit 160 of FIG. 1.

Referring to FIG. 6, the address control circuit 160 may include an active latch 162, an address calculation circuit 164, and an address output circuit 166.

The active latch 162 may generate an active address ACT_ADD by latching the row address RADD according to the active command ACT. For example, the active latch 162 may include a plurality of flip-flops corresponding to the number of bits of the row address RADD, to store the respective bits of the row address RADD in response to the active command ACT.

The address calculation circuit 164 may generate the adjacent address candidates by adding or subtracting a certain value to or from the active address ACT_ADD. For example, the address calculation circuit 164 may calculate first and second adjacent address candidates by adding or subtracting "+1" to or from the active address ACT_ADD, and third and fourth adjacent address candidates by adding or subtracting "+2" to or from the active address ACT_ADD. When the word lines are arranged sequentially in the column direction and the active address ACT_ADD is an address for designating an nth word line among the word lines, the first and second adjacent address candidates are addresses for designating n±1 word lines (i.e., physically closest word lines to the nth word line), and the third and fourth adjacent address candidates are addresses for designating n±2 word lines (i.e., physically closest word lines to the n±1 word lines). The address calculation circuit 164 may output one of the generated adjacent address candidates (i.e., the first to fourth adjacent address candidates) as the adjacent address ADJ_ADD. In an embodiment, the address calculation circuit 164 may output the adjacent address ADJ_ADD by randomly sampling one of the generated adjacent address candidates or sequentially selecting one of the generated adjacent address candidates.

The address output circuit 166 may output the row address X_RA by selecting one of the active address ACT_ADD and the adjacent address ADJ_ADD whenever the row active signal RACT is activated. For example, the address output circuit 166 may output the row address X_RA by selecting one of the active address ACT_ADD and the adjacent address ADJ_ADD when the row active signal RACT is activated once, and may output the row address X_RA by selecting the remaining one of the active address ACT_ADD and the adjacent address ADJ_ADD when the row active signal RACT is activated twice.

Figure 7A:
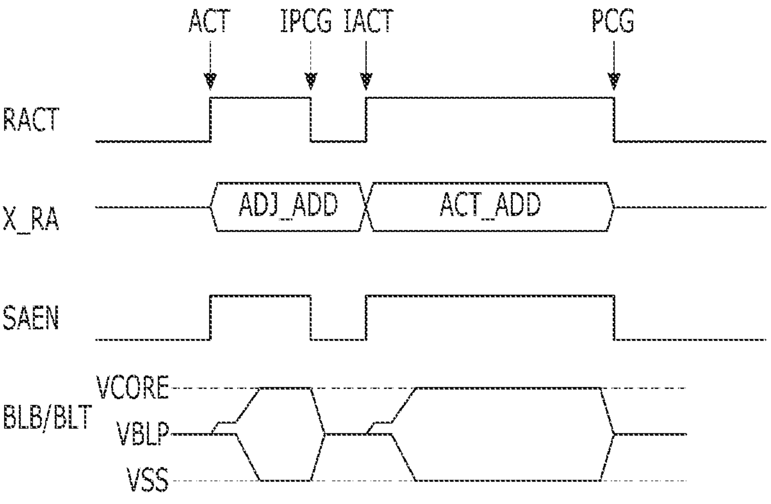
FIGS. 7A and 7B are timing diagrams for describing an operation of a memory device including the active control circuit of FIG. 4.
Figure 7B:
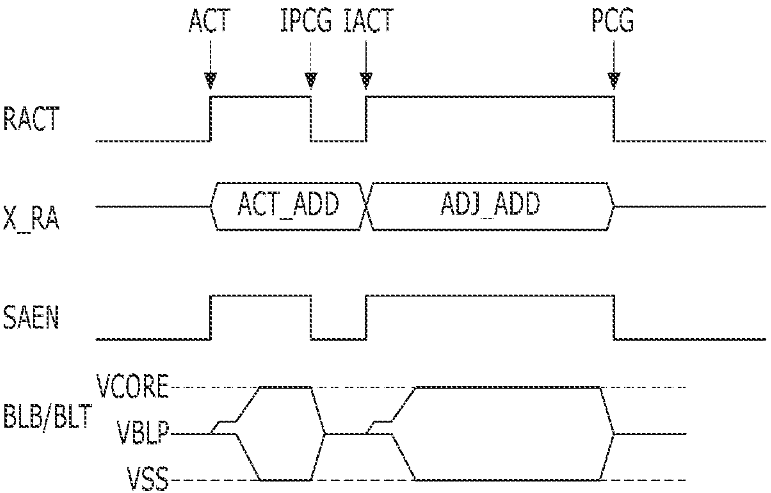

FIGS. 7A and 7B are timing diagrams for describing an operation of the memory device 100 including the active control circuit 150 of FIG. 4.

Referring to FIGS. 7A and 7B, the active control circuit 150 of the memory device 100 may activate the internal precharge signal IPCG after the minimum low active time (tRASmin) when the active command ACT is input. Accordingly, the row active signal RACT with the first activation section defined by the active command ACT and the internal precharge signal IPCG can be generated.

The address control circuit 160 may latch the row address RADD input with the active command ACT as the active address ACT_ADD. The address control circuit 160 may generate the adjacent address candidates by adding or subtracting a certain value to or from the active address ACT_ADD, and output one of the adjacent address candidates as the adjacent address ADJ_ADD.

As shown in FIG. 7A, the address control circuit 160 may select the adjacent address ADJ_ADD from the active address ACT_ADD and the adjacent address ADJ_ADD during the first activation section of the row active signal RACT and output the selected adjacent address ADJ_ADD as the row address X_RA. Alternatively, as illustrated in FIG. 7B, the address control circuit 160 may select the active address ACT_ADD from the active address ACT_ADD and the adjacent address ADJ_ADD during the first activation section of the row active signal RACT and output the selected active address ACT_ADD as the row address X_RA.

The address selection circuit 148 may output the row address X_RA as the final row address S_ADD, and the row control circuit 120 may activate at least one word line corresponding to the final row address S_ADD according to the row active signal RACT. At this time, the column control circuit 130 may sense and amplify data of bit lines BLB/BLT according to the sense amplifier enable signal SAEN controlled by the row active signal RACT. That is, the column control circuit 130 may sense and amplify the data of the bit lines BLB/BLT precharged with a precharge voltage VBLP, between a core voltage VCORE and a ground voltage VSS.

Thereafter, the active control circuit 150 may activate the internal active signal IACT after the minimum precharge time (tRPmin) from the activation of the internal precharge signal IPCG. Accordingly, the row active signal RACT with the second activation section defined by the internal active signal IACT and the precharge command PCG may be generated.

As illustrated in FIG. 7A, the address control circuit 160 may output the active address ACT_ADD as the row address X_RA during the second activation section of the row active signal RACT. Alternatively, as illustrated in FIG. 7B, the address control circuit 160 may output the adjacent address ADJ_ADD as the row address X_RA during the second activation section of the row active signal RACT.

The address selection circuit 148 may output the row address X_RA as the final row address S_ADD, and the row control circuit 120 may activate at least one word line corresponding to the final row address S_ADD according to the row active signal RACT. At this time, the column control circuit 130 may sense and amplify data of bit lines BLB/BLT according to the sense amplifier enable signal SAEN controlled by the row active signal RACT. That is, the column control circuit 130 may sense and amplify the data of the bit lines BLB/BLT precharged with a precharge voltage VBLP, between a core voltage VCORE and a ground voltage VSS.

As described above, in accordance with an embodiment of the present invention, when the active command ACT is input with the active address ACT_ADD for specifying a target word line, the memory device may perform an active operation on the target word line after refreshing one of adjacent word lines adjacent to the target word line as shown in FIG. 7A, or may perform a target refresh operation on the adjacent word lines after activating the target word line as shown in FIG. 7B. That is, by performing a target refresh operation on adjacent word lines together with an active operation on a target word line, circuits for detecting and storing target addresses for the target word line are unnecessary. As a result, a row hammer risk may be reduced while minimizing the area occupied by the circuits for detecting and storing the target addresses.

An embodiment in which the active control circuit 150 generates the internal active signal IACT and the internal precharge signal IPCG according to the precharge command PCG will now be described.

Figure 8:
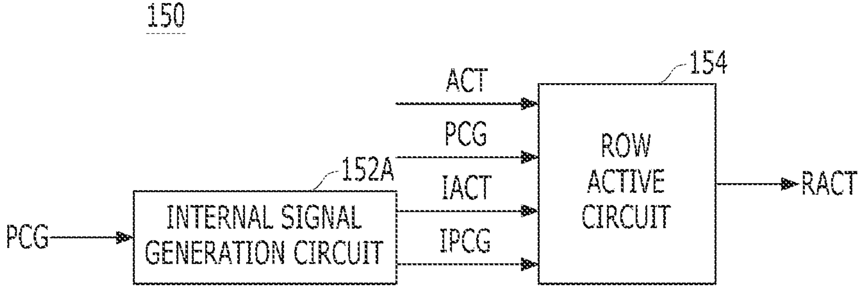
FIG. 8 is a detailed block diagram illustrating an active control circuit in accordance with another embodiment of the present invention.
Figure 9:
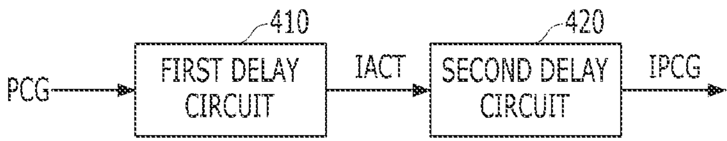
FIG. 9 is a detailed block diagram illustrating an internal signal generation circuit of FIG. 8.

FIG. 8 is a detailed block diagram illustrating the active control circuit 150 in accordance with another embodiment of the present invention. FIG. 9 is a detailed block diagram illustrating an internal signal generation circuit 152A of FIG. 8.

Referring to FIG. 8, the active control circuit 150 may include the internal signal generation circuit 152A and the row active circuit 154.

The internal signal generation circuit 152A may activate an internal active signal IACT after a second delay time from an input of a precharge command PCG and activate an internal precharge signal IPCG after a first delay time from an activation of the internal active signal IACT. In an embodiment of the present invention, the first delay time may correspond to the minimum row active time (tRASmin), and the second delay time may correspond to the minimum precharge time (tRPmin). That is, the internal signal generation circuit 152A may activate the internal active signal IACT after the minimum precharge time (tRPmin) from the input of the precharge command PCG and activate the internal precharge signal IPCG after the minimum row active time (tRASmin) from the activation of the internal active signal IACT. For example, referring to FIG. 9, the internal signal generation circuit 152A may include a first delay circuit 410 and a second delay circuit 420. The first delay circuit 410 may delay the precharge command PCG by the second delay time to generate the internal active signal IACT. The second delay circuit 420 may delay the internal active signal IACT by the first delay time to generate the internal precharge signal IPCG. Accordingly, the precharge command PCG, the internal active signal IACT, and the internal precharge signal IPCG may be sequentially activated.

The row active circuit 154 may generate the row active signal RACT that is activated according to the active command ACT or the internal active signal IACT and deactivated according to the internal precharge signal IPCG or the precharge command PCG. The row active circuit 154 of FIG. 8 may have substantially the same configuration as the row active circuit 154 of FIGS. 2 and 4.

Figure 10:
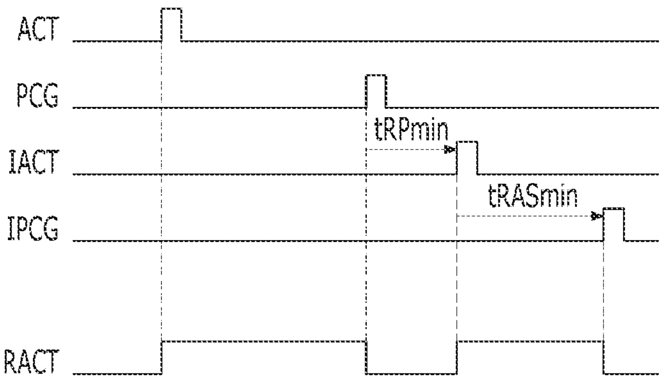
FIG. 10 is a timing diagram for describing an operation of the active control circuit of FIG. 8.

FIG. 10 is a timing diagram for describing an operation of the active control circuit 150 of FIG. 8.

Referring to FIG. 10, the internal signal generation circuit 152A may activate the internal active signal IACT after the minimum precharge time (tRPmin) from the input of the precharge command PCG and activate the internal precharge signal IPCG after the minimum row active time (tRASmin) from the activation of the internal active signal IACT. In this case, the memory controller may provide the active command ACT and the precharge command PCG to the memory device by setting an application interval from the precharge command PCG to the active command ACT to be longer than a time (tRPmin+tRASmin+tRPmin).

Since the precharge command PCG, the internal active signal IACT, and the internal precharge signal IPCG are activated sequentially, the row active circuit 154 may generate the row active signal RACT in which a first activation section is defined by the active command ACT and the precharge command PCG, and a second activation section is defined by the internal active signal IACT and the internal precharge signal IPCG.

Figure 11A:
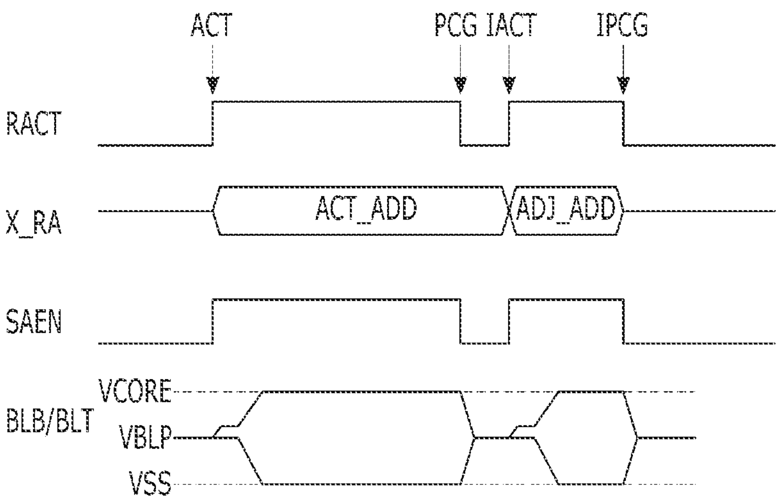
FIGS. 11A and 11B are timing diagrams for describing an operation of a memory device including the active control circuit of FIG. 8.
Figure 11B:
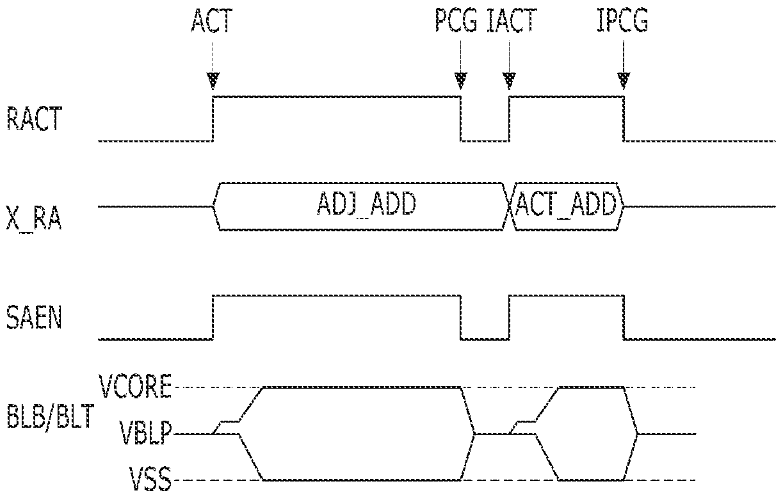

FIGS. 11A and 11B are timing diagrams for describing an operation of the memory device 100 including the active control circuit 150 of FIG. 8.

Referring to FIGS. 11A and 11B, as the active command ACT and the precharge commands PCG are sequentially input, the row active signal RACT with the first activation section defined by the active command ACT and the precharge commands PCG may be generated. The address control circuit 160 may latch the row address RADD input with the active command ACT as the active address ACT_ADD and generate the adjacent address ADJ_ADD by adding or subtracting a certain value to or from the active address ACT_ADD.

As shown in FIG. 11A, the address control circuit 160 may select the adjacent address ADJ_ADD from the active address ACT_ADD and the adjacent address ADJ_ADD during the first activation section of the row active signal RACT and output the selected adjacent address ADJ_ADD as the row address X_RA. Alternatively, as illustrated in FIG. 11B, the address control circuit 160 may select the active address ACT_ADD from the active address ACT_ADD and the adjacent address ADJ_ADD during the first activation section of the row active signal RACT and output the selected active address ACT_ADD as the row address X_ADD.

The address selection circuit 148 may output the row address X_RA as the final row address S_ADD, and the row control circuit 120 may activate at least one word line corresponding to the final row address S_ADD according to the row active signal RACT. At this time, the column control circuit 130 may sense and amplify data of bit lines BLB/BLT according to the sense amplifier enable signal SAEN controlled by the row active signal RACT.

Thereafter, the active control circuit 150 may activate the internal active signal IACT after the minimum precharge time (tRPmin) from the input of the precharge command PCG and activate the internal precharge signal IPCG after the minimum row active time (tRASmin) from the activation of the internal active signal IACT. Accordingly, the row active signal RACT with the second activation section defined by the internal active signal IACT and the internal precharge signal IPCG may be generated.

As illustrated in FIG. 11A, the address control circuit 160 may output the active address ACT_ADD as the row address X_RA during the second activation section of the row active signal RACT. Alternatively, as illustrated in FIG. 11B, the address control circuit 160 may output the adjacent address ADJ_ADD as the row address X_RA during the second activation section of the row active signal RACT. The row control circuit 120 may activate at least one word line corresponding to the row address X_RA according to the row active signal RACT.

As described above, in accordance with an embodiment of the present invention, when the active command ACT is input with the active address ACT_ADD for specifying a target word line, the memory device may perform an active operation on the target word line after refreshing one of adjacent word lines adjacent to the target word line as shown in FIG. 11A, or may perform a target refresh operation on the adjacent word lines after activating the target word line as shown in FIG. 11B. By performing a target refresh operation on adjacent word lines together with an active operation on a target word line, circuits for detecting and storing target addresses for the target word line are unnecessary. As a result, a row hammer risk may be reduced while minimizing the area occupied by the circuits for detecting and storing the target addresses.

Figure 12:
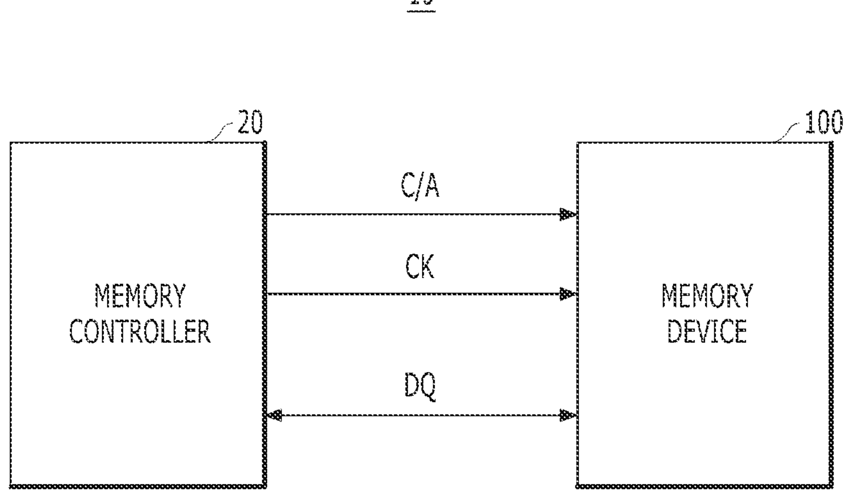
FIG. 12 is a block diagram illustrating a memory system in accordance with an embodiment of the present invention.

FIG. 12 is a block diagram illustrating a memory system 10 in accordance with an embodiment of the present invention.

Referring to FIG. 12, the memory system 10 may include a memory controller 20 and the memory device 100.

The memory controller 20 may control an overall operation of the memory device 100 by providing a clock CK and a command/address signal C/A to the memory device 100. The memory controller 20 may exchange data DQ with the memory device 100 during read and write operations. The memory controller 100 may input an active command ACT, a precharge command PCG, a read command RD, or a write command WT to the memory device 100 by transmitting a command included in the command/address signal C/A. The memory controller 100 may transmit an address included in the command/address signal C/A to select a word line of the memory device 100 along with the active command ACT.

The memory device 100 may have substantially the same configuration as the memory device 100 described in FIG. 1. When the active command ACT and the precharge command PCG are inputted along with a row address that specifies a target word line, the memory device 100 may perform a target refresh operation on one of the adjacent word lines after performing an active operation on the target word line, or may perform an active operation on the target word line after performing a target refresh operation on one of the adjacent word lines. Therefore, by performing the target refresh operation on the adjacent word lines during the active operation on the target word line, the row-hammer risk may be reduced while minimizing the area occupied by counting circuits, sampling circuits, and address storage circuits for detecting and storing target addresses for the target word line.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory device comprising:

an active control circuit configured to generate an internal precharge signal and an internal active signal which are sequentially activated, in response to an active command, and generate a row active signal having a first activation section that is defined by the active command and the internal precharge signal, and a second activation section that is defined by the internal active signal and a precharge command, wherein the internal precharge signal is activated after a first delay time from an input of the active command, and the internal active signal is activated after a second delay time from an activation of the internal precharge signal;

an address control circuit configured to generate a row address by selecting one of an active address and an adjacent address adjacent to the active address during the first activation section, and by selecting the remaining one during the second activation section; and a row control circuit configured, in response to the row active signal, a) to activate a target word line corresponding to the active address during one of the first and second activation sections, and b) to refresh an adjacent word line corresponding to the adjacent address during the remaining one of the first and second activation sections.

2. The memory device of claim 1, wherein the address control circuit is configured to:

generate adjacent address candidates by adding or subtracting a certain value to or from the active address, and output one of the adjacent address candidates as the adjacent address, and alternately output the active address and the adjacent address as the row address whenever the row active signal is activated.

3. The memory device of claim 1, wherein bit lines are precharged to a bit line precharge voltage during a time between the first activation section and the second activation section.

4. The memory device of claim 1, wherein the active control circuit includes:

an internal signal generation circuit configured to activate the internal precharge signal after the first delay time from the input of the active command, and activate the internal active signal after the second delay time from the activation of the internal precharge signal; and a row active circuit configured to generate the row active signal that is activated according to the active command or the internal active signal and is deactivated according to the internal precharge signal or the precharge command.

5. The memory device of claim 4, wherein the internal signal generation circuit includes:

a first delay circuit configured to generate the internal precharge signal by delaying the active command by a minimum row active time (tRASmin); and a second delay circuit configured to generate the internal active signal by delaying the internal precharge signal by a minimum precharge time (tRPmin).

6. A memory device, comprising:

an active control circuit configured to generate an internal active signal and an internal precharge signal which are sequentially activated, in response to a precharge command, and generate a row active signal having a first activation section that is defined by an active command and the precharge command, and a second activation section that is defined by the internal active signal and the internal precharge signal, wherein the internal active signal is activated after a second delay time from an input of the precharge command, and the internal precharge signal is activated after a first delay time from an activation of the internal active signal;

an address control circuit configured to generate a row address by selecting one of an active address and an adjacent address adjacent to the active address during the first activation section, and by selecting the remaining one during the second activation section; and a row control circuit configured, in response to the row active signal, a) to activate a word line corresponding to the row address during one of the first and second activation sections, and b) to refresh a word line corresponding to the adjacent address during the remaining one of the first and second activation sections.

7. The memory device of claim 6, wherein the active control circuit includes:

an internal signal generation circuit configured to activate the internal active signal after the second delay time from the input of the precharge command, and activate the internal precharge signal after the first delay time from the activation of the internal active signal; and a row active circuit configured to generate the row active signal that is activated according to the active command or the internal active signal and is deactivated according to the internal precharge signal or the precharge command.

8. The memory device of claim 7, wherein the internal signal generation circuit includes:

a first delay circuit configured to generate the internal active signal by delaying the precharge command by a minimum precharge time (tRPmin); and a second delay circuit configured to generate the internal precharge signal by delaying the internal active signal by a minimum row active time (tRASmin).

9. The memory device of claim 6, wherein the address control circuit includes:

an address calculation circuit configured to generate adjacent address candidates by adding or subtracting a certain value to or from the active address, and output one of the adjacent address candidates as the adjacent address, and an address output circuit configured to alternately output the active address and the adjacent address as the row address whenever the row active signal is activated.

10. The memory device of claim 9, further comprising:

an active latch configured to generate the active address by latching an input address according to the active command.

11. The memory device of claim 9, wherein the address output circuit is configured to output the row address by selecting one of the active address and the adjacent address when the row active signal is activated once, and by selecting the remaining one of the active address and the adjacent address when the row active signal is activated twice.

12. An operating method of a memory device, the operating method comprising:

generating an internal precharge signal after a first delay time from an input of an active command;

activating at least one first word line corresponding to one of an active address and an adjacent address according to the active command, and deactivating the activated first word line according to the internal precharge signal;

generating an internal active signal after a second delay time from an activation of the internal precharge signal; and activating at least one second word line corresponding to the remaining one of the active address and the adjacent address according to the internal active signal, and deactivating the activated second word line according to a precharge command.

13. The operating method of claim 12, further comprising:

generating the active address by latching an input address according to the active command; and generating adjacent address candidates by adding or subtracting a certain value to or from the active address, and outputting one of the adjacent address candidates as the adjacent address.

14. The operating method of claim 12, wherein the internal precharge signal is activated after a minimum row active time (tRASmin) from the input of the active command, and wherein the internal active signal is activated after a minimum precharge time (tRPmin) from the activation of the internal precharge signal.

15. An operating method of a memory device, the operating method comprising:

activating at least one first word line corresponding to one of an active address and an adjacent address according to an active command, and deactivating the activated first word line according to a precharge command;

generating an internal active signal after a second delay time from an input of the precharge command;

generating an internal precharge signal after a first delay time from an activation of the internal active signal; and activating at least one second word line corresponding to the remaining one of the active address and the adjacent address according to the internal active signal, and deactivating the activated second word line according to the internal precharge signal.

16. The operating method of claim 15, further comprising:

generating the active address by latching an input address according to the active command; and generating adjacent address candidates by adding or subtracting a certain value to or from the active address, and outputting one of the adjacent address candidates as the adjacent address.

17. The operating method of claim 15, wherein the internal active signal is activated after a minimum precharge time (tRPmin) from the input of the precharge command, and wherein the internal precharge signal is activated after a minimum row active time (tRASmin) from the activation of the internal active signal.

18. A memory system comprising:

a controller configured to provide an active command, a precharge command, and a row address; and a memory device configured to:

generate an internal precharge signal and an internal active signal which are sequentially activated, in response to the active command, wherein the internal precharge signal is activated after a first delay time from an input of the active command, and the internal active signal is activated after a second delay time from an activation of the internal precharge signal, generate a row active signal having a first activation section that is defined by the active command and the internal precharge signal, and a second activation section that is defined by the internal active signal and the precharge command, activate a target word line corresponding to the row address during one of the first and second activation sections, and refresh an adjacent word line adjacent to the target word line during the remaining one of the first and second activation sections, in response to the row active signal.

19. The memory system of claim 18, wherein bit lines are precharged to a bit line precharge voltage between the first activation section and the second activation section.

20. A memory system comprising:

a controller configured to provide an active command, a precharge command, and a row address; and a memory device configured to:

generate an internal active signal and an internal precharge signal which are sequentially activated, in response to the precharge command, generate a row active signal having a first activation section that is defined by the active command and the precharge command, and a second activation section that is defined by the internal active signal and the internal precharge signal, wherein the internal active signal is activated after a second delay time from an input of the precharge command, and the internal precharge signal is activated after a first delay time from an activation of the internal active signal, activate a target word line corresponding to the row address during one of the first and second activation sections, and refresh an adjacent word line adjacent to the target word line during the remaining one of the first and second activation sections, in response to the row active signal.

* * * * *